(12) United States Patent
Monka et al.

(10) Patent No.: US 12,044,437 B2
(45) Date of Patent: Jul. 23, 2024

(54) VENTILATION ARRANGEMENT AND DEVICE HAVING A VENTILATION ARRANGEMENT

(71) Applicant: SIEMENS ENERGY GLOBAL GMBH & CO. KG, Munich (DE)

(72) Inventors: Roland Monka, Berlin (DE); Marcel Weigel, Berlin-Blankenburg (DE)

(73) Assignee: Siemens Energy Global GmbH & Co. KG, Munich (DE)

( * ) Notice: Subject to any disclaimer, the term of this patent is extended or adjusted under 35 U.S.C. 154(b) by 490 days.

(21) Appl. No.: 17/296,283

(22) PCT Filed: Nov. 5, 2019

(86) PCT No.: PCT/EP2019/080181
§ 371 (c)(1),
(2) Date: May 24, 2021

(87) PCT Pub. No.: WO2020/104182
PCT Pub. Date: May 28, 2020

(65) Prior Publication Data
US 2022/0010990 A1    Jan. 13, 2022

(30) Foreign Application Priority Data

Nov. 23, 2018  (DE) ............... 10 2018 220 186.2

(51) Int. Cl.
| | | |
|---|---|---|
| *F24F 7/02* | (2006.01) | |
| *F24F 7/00* | (2021.01) | |
| *F24F 7/003* | (2021.01) | |
| *F24F 13/08* | (2006.01) | |
| *H02B 1/56* | (2006.01) | |
| *H05K 5/02* | (2006.01) | |

(52) U.S. Cl.
CPC ................ *F24F 7/02* (2013.01); *F24F 7/003* (2021.01); *F24F 13/08* (2013.01); *H02B 1/565* (2013.01); *H05K 5/0213* (2013.01); *F24F 2007/0025* (2021.01)

(58) Field of Classification Search
CPC .... F24F 7/02; F24F 7/003; F24F 13/08; F24F 2007/0025; H02B 1/565; H02B 1/28; H02B 1/56; H05K 5/0213
USPC ....................................................... 454/339
See application file for complete search history.

(56) References Cited

U.S. PATENT DOCUMENTS

| | | |
|---|---|---|
| 1,569,845 A | 1/1926 | Murphy |
| 2,494,679 A | 1/1950 | Ward, Jr. |
| 2,526,290 A | 10/1950 | Solzman |

(Continued)

FOREIGN PATENT DOCUMENTS

| | | |
|---|---|---|
| CN | 101395037 A | 3/2009 |
| CN | 205812602 U | 12/2016 |

(Continued)

*Primary Examiner* — Steven B Mcallister
*Assistant Examiner* — Charles R Brawner
(74) *Attorney, Agent, or Firm* — Laurence A. Greenberg; Werner H. Stemer; Ralph E. Locher

(57) ABSTRACT

A ventilation arrangement has a ventilation channel with a mouth opening and a first shielding hood shielding the mouth opening. The ventilation channel widens and/or narrows in cross section towards the mouth opening. The mouth opening is encompassed by the first shielding hood, leaving free a gap.

16 Claims, 4 Drawing Sheets

(56) References Cited

U.S. PATENT DOCUMENTS

| | | | | |
|---|---|---|---|---|
| 2,875,678 | A * | 3/1959 | Shepherd | F24F 7/025 |
| | | | | 454/355 |
| 3,714,884 | A * | 2/1973 | Christiansen | F16L 55/02 |
| | | | | 138/40 |
| 2005/0022878 | A1 | 2/2005 | Erinakes | |
| 2009/0109618 | A1 | 4/2009 | Yano | |
| 2014/0194053 | A1* | 7/2014 | Carroll | F24F 13/20 |
| | | | | 454/367 |
| 2015/0050873 | A1 | 2/2015 | Dengler | |
| 2016/0105995 | A1 | 4/2016 | Falk | |
| 2017/0370610 | A1* | 12/2017 | Parry | B60H 1/26 |
| 2018/0119968 | A1* | 5/2018 | Lin | B60H 1/243 |
| 2018/0119969 | A1* | 5/2018 | Lin | B60H 1/262 |
| 2020/0094971 | A1* | 3/2020 | Etchessahar | B64D 13/06 |
| 2021/0156578 | A1* | 5/2021 | Park | F24F 13/02 |

FOREIGN PATENT DOCUMENTS

| | | |
|---|---|---|
| CN | 206520574 U | 9/2017 |
| CN | 206947746 U | 1/2018 |
| DE | 1883066 U | 11/1963 |
| DE | 68902437 T2 | 2/1993 |
| DE | 4313776 C1 | 10/1994 |
| DE | 102012207013 A1 | 10/2013 |
| DE | 102012213438 A1 | 5/2014 |
| GB | 2538544 A | 11/2016 |
| JP | H10270878 A | 10/1998 |
| WO | 2013160070 A1 | 10/2013 |

\* cited by examiner

VENTILATION ARRANGEMENT AND DEVICE HAVING A VENTILATION ARRANGEMENT

BACKGROUND OF THE INVENTION

Field of the Invention

The invention relates to a ventilation arrangement for a housing, having a ventilation channel with a mouth opening and a first shielding hood shielding the mouth opening.

A ventilation arrangement is known, for example, from laid-open application DE 10 2012 213 438 A1. The latter describes a housing which has a variable volume and the interior of which is connected to the surroundings by means of a ventilation channel and a mouth opening. The mouth opening is shielded by a shielding hood.

The mouth opening is protected by means of the shielding hood against direct access. In particular in various installation positions, the shielding hood is effective only to a limited extent. In these cases, there is the risk of, for example, foreign bodies penetrating the mouth opening or the ventilation channel. Accordingly, ventilation arrangements which are adapted in each case for different installation positions have to be provided, or a special assembly position has to be ensured during the assembly. Keeping different ventilation arrangements in stock is costly. The realization of specific assembly instructions for obtaining certain installation positions has proven susceptible to error.

SUMMARY OF THE INVENTION

Accordingly, it is an object of the invention to specify a ventilation arrangement which can be installed universally.

According to the invention, the object is achieved in the case of a ventilation arrangement of the type mentioned at the beginning in that the ventilation channel widens and/or narrows in cross section toward the mouth opening, and the mouth opening is encompassed by the first shielding hood, leaving a gap free An exchange of fluids from the interior of one housing into another housing or, for example, into the surroundings, etc. is possible via the ventilation channel of the ventilation opening. Gases, in particular atmospheric air, can preferably pass through the ventilation channel. A fluid can therefore flow through the ventilation channel, and the latter constitutes a communication path for a fluid between an interior of the housing and another volume, for example the surroundings. The mouth opening is bounded by a mouth edge and constitutes the point at which, for example, a fluid passes/enters, for example, into the surroundings/into the housing, or into another housing, etc.

In addition to a desired circulation of a fluid, foreign bodies (for example particles, foreign fluids, fluids having a differing state of aggregation) could pass into the interior of the housing via the mouth opening. The shielding hood extends an access path to the mouth opening of the ventilation channel such that entry of foreign matter (for example, particles, fluids, etc.) into the ventilation channel or into the mouth opening thereof is made difficult or preferably is prevented. The shielding hood preferably forms a barrier at the mouth opening such that the mouth opening is spanned by the first shielding hood. Direct, for example linear, access to the mouth opening is thus prevented. A gap, in particular an annular gap, is preferably formed between the first shielding hood and the ventilation channel and assists in a deflection of the fluids emerging from the ventilation opening or entering the ventilation opening to pass into the mouth opening. The deflection is intended to take place here by at least 180° with respect to a perpendicular of the mouth opening. By means of a widening or narrowing, i.e., for example, a funnel-like or conical tapering of the ventilation channel, the flow in the region of the mouth opening can be influenced in respect of its flow speed or the distribution of the emerging or entering fluid. An acceleration or deceleration in the inlet or outlet direction of the mouth opening can thus be promoted or reduced as required. The shape of the flow may have an influence, for example, on rotation or laminar guidance by means of a narrowing and/or widening. A transition from a narrowing to widening of the cross section of the ventilation channel and vice versa also makes it possible to form a nozzle in the ventilation channel. In particular during a transition of the cross-sectional change to an outer casing surface of a wall bounding the ventilation channel, this outer region of the ventilation channel can also be used in order to influence the flow.

The fluid emerging from the ventilation channel is preferably intended to impact against the first shielding hood, or, in the event of a reverse flow, to pass from the region of the first shielding hood into the mouth opening. The use of an annular gap, i.e. a gap which encircles the mouth opening in an approximately inherently closed manner, enables a symmetrical, uniform deflection or splitting of the fluid flow from or into the mouth opening. The mouth opening and the ventilation channel are preferably intended to have a rotationally symmetrical form, thus also resulting in a preferably approximately circular ring-shaped annular gap. The gap can optionally also be divided into individual segments, for example in order to permit a stabilizing arrangement of retaining struts or similar.

It can be provided, in a further advantageous refinement, that the first shielding hood for encompassing the mouth opening has a cross-sectional change directed in the opposite direction to the cross-sectional change of the ventilation channel in the region of the mouth opening.

The cross section of the ventilation channel can widen toward the mouth opening. Accordingly, in the event of a cross-sectional change in the opposite direction, the shielding hood for encompassing the mouth opening can undergo a reduction in its cross section. A cross-sectional reduction at the mouth opening of the ventilation channel and a cross-sectional widening of the first shielding hood can also be provided. A gap can thus be formed between ventilation channel and shielding hood, said gap being deflected from a perpendicular with respect to the mouth opening when fluid emerges or fluid enters the gap.

The fluid can thus pass through the gap and can be driven, for example, against a wall of the ventilation channel or can be "sucked off" said wall. In a reverse variant, for example when a cross-sectional reduction in the ventilation channel is provided in the region of the mouth opening, a corresponding cross-sectional widening of the shielding hood can be provided such that the resulting annular gap causes fluid to emerge or enter facing away from a wall of the ventilation channel. In particular, an outer wall of the ventilation channel can be provided for the incoming flow or outgoing flow. In particular when rotationally symmetrical arrangements are used for the ventilation channel or for the gap, the fluid can emerge radially on all sides or the fluid can be sucked up radially on all sides around the ventilation arrangement. This affords advantages, for example, during assembly since, because of the rotationally symmetrical design, specific assembly positions do not need to be kept to.

In a further advantageous refinement, it can be provided that mutually facing mouth edges of ventilation channel and first shielding hood do not undercut one another.

The mouth opening of the ventilation channel is bounded by a mouth edge. The gap is at least partially bounded by the first shielding hood. In the direction of the perpendicular outlet axis of the mouth opening (in particular with respect to the position of the mouth edge), the mouth edges of ventilation opening and shielding hood are advantageously dimensioned in such a manner that a gap is formed between them, but the mouth edges do not undercut one another. When the ventilation arrangement is joined together, joining together of first shielding hood and ventilation channel is thus simplified. By varying a cross section of the ventilation channel or of the shielding hood, the flow of entering and emerging fluid can be controlled in a targeted manner and said flow can be oriented toward the ventilation channel or directed away from the ventilation channel. However, the gap remains free from a rear engagement of the first shielding hood or of the mouth edge of the ventilation channel. There is thus a possibility of directing flows and of dispensing with sharp-edged or tightly concentrated deflections for the flow path of the fluid. Such narrow radii or sharp-edged deflections prevent a defined flow of the fluid and lead to swirling, which would make ventilation via the ventilation channel more difficult. However, it is an aim specifically, despite use of the first shielding hood, to permit a flow of the fluid with as little resistance as possible into and from the ventilation channel and, in the process, to ensure as stable a protective effect as possible for the mouth opening by means of the first shielding hood.

In an advantageous manner, it can be provided that the first shielding hood is encompassed by a second shielding hood.

The use of a first and a second shielding hood makes it possible to protect the first shielding hood against direct contact. The second shielding hood can thus protect the first shielding hood, for example, against weathering or against harmful radiation, such as UV radiation. The use of a first and a second shielding hood furthermore permits a two-shell design such that a channel, in which, for example, a fluid can also be conducted, is formed between the first shielding hood and the second shielding hood.

In a further advantageous refinement, it can be provided that the second shielding hood is connected to a wall of the ventilation channel, wherein the first shielding hood is supported on the second shielding hood so as to be suspended in front of the mouth opening.

The second shielding hood is advantageously connected to a wall of the ventilation channel. For example, the ventilation channel can be substantially rotationally symmetrical in its profile with a virtually consistent wall thickness, with the second shielding hood being fastened to the wall. The second shielding hood can advantageously be fastened to the outer casing side of the wall of the ventilation channel such that the ventilation channel is embraced by the second shielding hood. The possibility thereby exists of arranging the first shielding hood inside the second shielding hood and of fastening the first shielding hood, for its part, to the second shielding hood, as a result of which the first shielding hood can span the mouth opening in a freely suspended manner. This ensures easy entry or emerging of fluid into or from the mouth opening of the ventilation channel. Swirling which is undesirable, for example due to holding structures, is thus reduced. The first and the second shielding hood can in turn be arranged at a distance from one another such that a channel in which an inflowing or outflowing fluid can be directed and conducted is formed between first and second shielding hood. The first shielding hood can preferably have a supporting structure, for example retaining struts, on a side facing away from the mouth opening, in order to be connected there to the second shielding hood.

Furthermore, it can advantageously be provided that coaxially running grooves are arranged on the outer casing side of the ventilation channel and on the outer casing side of the second shielding hood.

The use of a groove, both on the ventilation channel and on the second shielding hood, makes it possible to provide separation edges at which, for example, interfering particles or fluids (for example, liquids in gases) can be deposited. For example, it can be provided that the fluid flowing through the ventilation channel is a gaseous fluid which could be contaminated by a liquid fluid. Liquids which would contaminate the fluid flow can be deposited in the grooves. In particular from outside the ventilation channel, i.e. outside the region protected by the shielding hoods, contaminants, such as particles or liquids, can gravitate toward the mouth opening. The use of coaxial grooves on the outer casing side both of the ventilation channel and of the second shielding hood can thus result in the formation of a double barrier which deflects liquids, particles, etc. from the mouth opening of the ventilation channel. In particular with a coaxial configuration of the ventilation arrangement, i.e. with the use of a rotationally symmetrical ventilation channel, a rotationally symmetrical wall of the ventilation channel, a rotationally symmetrical first and rotationally symmetrical second shielding hood, there is thus the possibility of allowing liquids to run off via the grooves irrespective of the installation position, specifically into non-critical regions, such that it is difficult for liquids to penetrate the mouth opening of the ventilation channel. In order to form a groove, the wall of the ventilation channel or the wall of the second shielding hood can in each case have a virtually consistent thickness, with a groove being formed, for example, by beading or profiling of the wall. However, it can also be provided that a groove is formed by a reduction in the respective wall thickness. A groove forms a flute which is used for conducting in particular a liquid fluid or particles.

In a further advantageous refinement, it can be provided that the first shielding hood has a groove running coaxially on the inner casing side.

By means of the position of the first shielding hood between the mouth opening of the ventilation channel and the second shielding hood, an inner-casing-side arrangement of a groove in the first shielding hood should advantageously be provided. There is thereby the possibility of collecting particles, liquids, etc., inside the second shielding hood in the opposite direction to grooves provided, for example, on the outer casing side of the second shielding hood or of the ventilation channel. As a result, in a wide variety of installation positions, for example vertically with respect to the outlet direction of the mouth opening or obliquely with respect to the outlet direction or upside down with respect to the outlet opening, particles, liquids or other foreign matter which could pass through the barrier of the second shielding hood can be conducted away or deflected within the first shielding hood. For example, dripping liquid can be caught in the groove of the first shielding hood and conducted away from the mouth opening of the ventilation channel. The grooves in the first shielding hood and on the second shielding hood and also on the wall of the ventilation channel should in each case be oriented coaxially with respect to one another. The cross section of the grooves can vary here, but it has proven advantageous to form the grooves in cross section with an ellipsoidal profile.

In an advantageous manner, it can be provided that a groove base of the groove of the ventilation channel is arranged in an axial sequence below groove bases of the grooves of the first and the second shielding hood.

In particular in the case of a coaxial arrangement of the grooves, an axial offset between the grooves of the shielding hoods and the groove of the ventilation channel can be provided by an axial sequence in the direction of the coaxial axis. With regard to the axial offset, the focus is preferably on the position of the respective groove bases, i.e., for example, an apex point of the respective groove, irrespective of the selection of the cross section of the groove. The groove base of the groove of the ventilation channel should be located here below the groove bases of the grooves of the first and the second shielding hood. The position "below" is defined here with respect to the axis of the outlet direction of the mouth opening of the ventilation channel, said axis advantageously also corresponding to the coaxial axis of coaxial grooves.

Furthermore, it can advantageously be provided that a groove base of the groove of the first shielding hood is arranged in an axial sequence both above the groove base of the groove of the ventilation channel and above the groove base of the groove of the second shielding hood.

By means of the position of the groove base of the first shielding hood both above the groove base of the ventilation channel and above the groove base of the groove of the second shielding hood, despite the two shielding hoods which are arranged at a distance from each other and proceed in an axial sequence from the mouth opening of the ventilation channel, foreign matter and undesired fluids are conducted away or slide away from the mouth opening in various installation positions. In particular with an outer-casing-side position of the groove of the first shielding hood, a labyrinth structure can thus be produced in the interior of the ventilation arrangement, said labyrinth structure having grooves which open in opposite directions in each case from labyrinth path to labyrinth path such that dripping, for example, of liquids is ensured and the latter are ultimately conducted away from the mouth opening and conducted to outside the ventilation arrangement. The second shielding hood can have an inner-casing-side groove in addition to the outer-casing-side groove. The inner-casing-side groove and the outer-casing-side groove can open in substantially opposite directions. In particular, oppositely directed groove flanks can be formed on the same wall, but can lie on different sides.

In a further advantageous refinement, it can be provided that a ventilation opening is arranged at least in one groove flank of a groove at a distance from the respective groove base of the respective groove.

A valve opening is an opening in a wall of a shielding hood, the opening permitting passage of fluids/foreign matter. The arrangement of a ventilation opening in a groove flank gives rise to the possibility firstly of allowing a fluid/foreign matter to pass from the outside into the region of the groove and second to be deflected or deposited there in the region of the groove base. For example, it is thus possible to direct and conduct liquid penetrating the ventilation arrangement into a groove via the ventilation opening, to conduct said liquid away there and to direct it outward or into a further groove, optionally via a further ventilation opening. Therefore, despite the use of ventilation openings in shielding hoods, it is ensured that, firstly, a fluid flow can emerge from or enter into the mouth opening, but, secondly, particles and foreign matter are entered or deposited into a non-critical region. Particles/foreign matter can be conducted further via the groove base to suitable ventilation openings.

In a further advantageous refinement, it can be provided that a filter is arranged in the ventilation channel.

A filter serves for retaining particles in order to prevent their passage through the ventilation channel. Depending on the filter configuration, the permeability of the filter can vary and particles of a greater or lesser size can be held back. This filter is provided to prevent large particles penetrating the ventilation channel despite the shielding hoods of the ventilation arrangement from being conducted further. The filter can be designed, for example, in the form of a mesh or a gauze or in similar structures. The filter can preferably lie in the region of the ventilation channel in which the mouth opening is arranged. In particular, the filter can extend in that region of the ventilation channel in which the latter undergoes a cross-sectional narrowing or cross-sectional widening.

In a further advantageous refinement, it can be provided that a stop for a casing-side thread, in particular outer-casing-side thread, is arranged on a wall of the ventilation channel.

A stop can be provided on the ventilation channel in order to allow said ventilation channel to butt, for example, against a housing. The stop can be, for example, an encircling collar which extends in particular on the outer casing side around the ventilation channel. The collar can extend from a wall which bounds the ventilation channel.

At the collar, it can be provided in particular that the ventilation channel extends there with a consistent cross section, or that the wall there has a consistent cross section. For example, it is thus possible to use the wall of the ventilation channel firstly for bounding same and secondly, on the inner or outer casing side, also to provide a thread which lies substantially coaxially with respect to the outflow direction of the mouth opening. As a result, it is possible, for example, to allow the ventilation channel to protrude through an opening of a housing and to support the collar on the housing and to screw down the ventilation arrangement with the use of a threaded nut (for example union nut), wherein, with the interposition of a housing wall between threaded nut and collar, a force-fitting assembly is formed.

In a further advantageous refinement, it can be provided that at least one of the shielding hoods is supported on the stop.

The mechanical stability of the stop means that the latter can be used to support at least one of the shielding hoods there. A shielding hood can be supported indirectly or directly on the stop. For example, the stop can encircle annularly in an inherently closed manner, thus also giving rise to a suitable possibility, when a shielding hood is formed coaxially, to allow said shielding hood to lie in an annularly encircling manner on the stop. For example, the shielding hood can butt against the stop such that, for example, at the outer circumference of the stop, in particular in the case of a rotationally symmetrical configuration, a shielding hood butts against the stop and merges in the latter.

In a further advantageous refinement, it can be provided that at least one ventilation opening is arranged in a joint between a shielding hood and the stop.

A ventilation opening can extend in a suitable manner at a joint between the stop and shielding hood. In the region of the joint, a flute or a trough can be formed between shielding hood and stop, in which, for example, particles or liquids collect. In particular, it can be provided that the flute forming in the region of the joint extends in a complementary shape to a groove arranged in the respectively abutting shielding hood. For example, a groove can be arranged in the abutting shielding hood on the outer casing side, wherein a groove flank of said groove lies in a wall which bounds the flute on the inner casing side in the region of the joint. The flute can furthermore be bounded by the stop. A ventilation opening can extend in particular in a flute base.

Irrespective of the position of a ventilation opening, use of a plurality of ventilation openings can advantageously be provided, said ventilation openings being arranged distributed in a groove or a flute, for example in particular when said groove or flute is shaped coaxially or in an inherently closed manner. There is therefore the possibility of shortening the distance which, for example, a particle has to cover to be conducted out of the flute or the joint. Furthermore, various installation positions can thus be realized since a particle or else a liquid can always be conducted away or deflected from a joint or a groove over a short distance.

In a further advantageous refinement, it can be provided that the ventilation arrangement is manufactured additively.

Within the context of this application, additive manufacturing is understood as meaning the use of a layer by layer building up of the ventilation arrangement. For example, it is thus possible to form an integral ventilation arrangement which, in the interior of the second shielding hood, has the structure of the first shielding hood and forms ventilation openings, channels, etc. there on the inner side. In particular, the formation of a filter in the course of the ventilation channel permits efficient use of additive manufacturing. The ventilation arrangement can be formed, for example, from electrically conductive material.

In a further advantageous refinement, it can be provided that the ventilation arrangement is UV-stable.

The design of a UV-stable ventilation arrangement means that the latter is suitable for use even for operation outside, for example under exposure to the sun. In this case, the material from which the walls of the ventilation arrangements are formed can themselves be UV-stable, for example can be a UV-stable plastic. However, it can also be provided that the ventilation arrangement is additionally coated or covered such that it is protected from the direct effect of UV radiation.

It is a further object of the invention to specify a suitable location for use of a ventilation arrangement according to the invention. According to the invention, the object is achieved in the case of a device, in particular a switch cabinet having a closed housing with a housing wall, in that the housing wall is penetrated by a ventilation arrangement according to one of the above embodiments.

A device, in particular a switch cabinet, has a corresponding housing, the interior of which preferably has electrical components, such as terminals, switches, electric lines, etc., wherein the interior of the switch cabinet is on the one hand closed, in order to prevent direct access, but on the other hand the interior of the housing is in fluid communication with the surroundings of the housing in order, for example, to remove moisture from the interior of the device, in particular from the housing. The device can be in particular a switch cabinet, i.e. assemblies are arranged in the interior of the switch cabinet, in order to control devices electrically or pneumatically or in some other way. For example, electric switching systems and switching devices can thus be actuated. However, a drive device can also be positioned within a switch cabinet, said drive device, for example, outputting kinetic energy by the latter being converted from another energy, for example temporarily stored electrical energy or mechanical energy. For example, a spring charging motor can be arranged in the device, said spring charging motor being used there to tension a spring and, for this purpose, being electrically activated.

The housing wall can have, for example, an opening into which the ventilation arrangement projects, and the latter comes into contact, for example, with a stop on a housing wall surrounding an opening and being screwed down to the housing wall using a screw connection. Owing to the configuration according to the invention of the ventilation arrangement, the housing can now be mounted in a wide variety of positions. Irrespective of the position of the housing, the ventilation arrangement protects against an undesired penetration of foreign bodies, such as particles and liquids, etc., into the interior of the housing.

BRIEF DESCRIPTION OF THE SEVERAL VIEWS OF THE DRAWING

An exemplary embodiment of the invention is shown below schematically in a drawing and described in more detail below. In the drawing

DETAILED DESCRIPTION OF THE INVENTION

Figure 1:
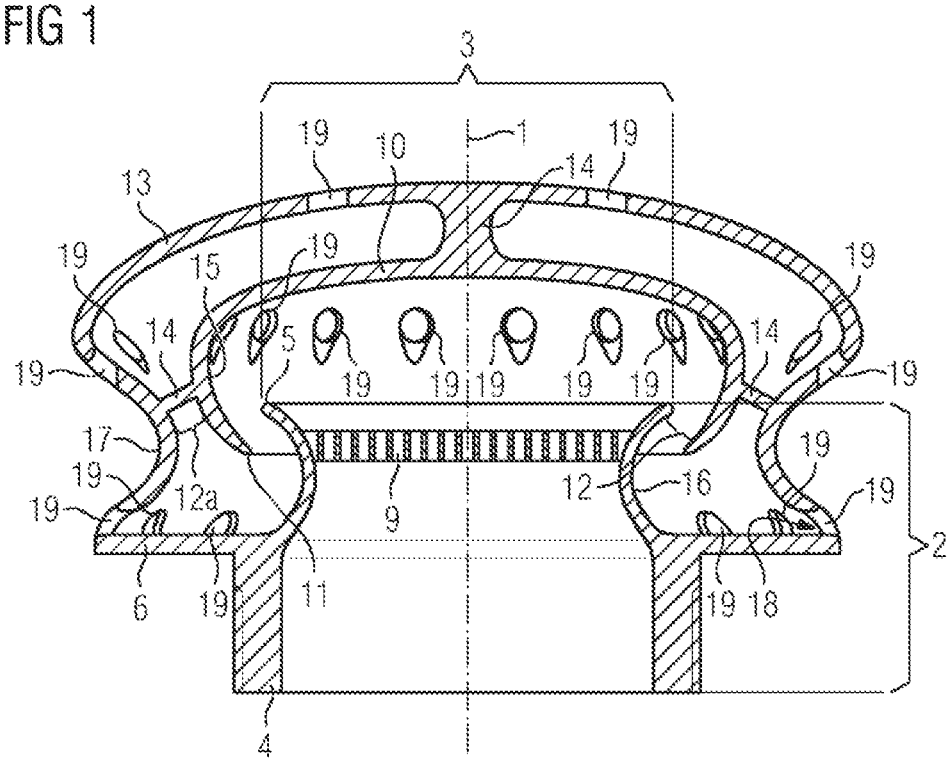
FIG. 1 shows a cross section through a ventilation arrangement.

The ventilation arrangement shown in FIG. 1 is formed substantially rotationally symmetrical with respect to an axis of rotation 1. A rotationally symmetrical ventilation channel 2 is arranged coaxially with respect to the axis of rotation 1. The ventilation channel 2 has a rotationally symmetrical section which widens in cross section in the region of a mouth opening 3. For this purpose, the ventilation channel 2 is provided with a reduction in the thickness of a wall 4. Proceeding from a cylindrical section of the ventilation channel 2, the latter is first of all provided with a cross-sectional tapering along the axis of rotation 1 in the direction of the mouth opening 3 in order subsequently to undergo widening. The mouth opening 3 is bounded here by a mouth edge 5. The mouth edge 5 here is circular ring-shaped and forms the end of the widening cross section of the ventilation channel 2. A stop 6 is arranged at the transition from the cylindrical section of the ventilation channel 2 to the cross-sectionally reduced or widened section of the ventilation channel 2. The stop 6 is arranged in a substantially circular ring-shaped manner around the outer casing side of the ventilation channel 2 and forms a flush assembly with the wall of the ventilation channel 2. A thread is arranged on the outer casing side of the wall of the ventilation channel 2, said wall surrounding the hollow-cylindrical section. A union nut 7 can be screwed onto the thread (cf. FIG. 3). The section of the ventilation channel 2 which bears the thread can be plugged through an opening in a wall, with the entry depth being limited by the stop 6. The ventilation arrangement can be screwed and secured, for example, to a housing wall by the union nut 7 being screwed on and optionally with the use of a seal 8 (cf. FIG. 3). The ventilation channel 2 penetrates the housing wall into which the ventilation arrangement is inserted. Furthermore, a filter 9 is arranged within the ventilation channel 2. The filter 9 is arranged here within the ventilation channel 2 in the form of a mesh substantially perpendicular to the axis of rotation (cf. FIG. 2). Passage of coarse particles through the ventilation channel 2 is prevented by the filter 9.

A first shielding hood 10 is positioned at a distance from the mouth opening 3, in a manner shielding the mouth opening 3 and suspended in front of the latter. The first shielding hood 10 has a structure which is substantially rotational, with the wall of the first shielding hood 10 being curved concavely in a manner substantially pointing in the direction of the mouth opening 3. The mouth edge 11 which closes the hood-shaped structure is provided with a larger cross section than the mouth edge 5 of the mouth opening 3 of the ventilation channel 2. Accordingly, the first shielding hood 10 is placed over the mouth edge 5 of the mouth opening 3 of the ventilation channel 2 with an annular gap 12 being formed in the direction of the axis of rotation 1. An annular gap 12 is formed between the mouth edges 5, 11 of the ventilation channel 2 and the first shielding hood 10, wherein the annular gap 12 itself is free from structures crossing it, such as webs or similar. This is achieved by the first shielding hood 10 being arranged in a freely suspended manner in front of the mouth opening 3. Owing to the cross-sectional widening in the region of the mouth opening 3 of the ventilation channel 2 and the cross-sectional reduction of the first shielding hood 10 in the region of the mouth edge 11, the wall sections of the first shielding hood 10 and of the ventilation channel 2, said wall sections bounding the annular gap 12, are oriented in a manner converging toward each other, i.e. are oriented substantially parallel. Accordingly, the annular gap 12 is arranged radially with respect to the axis of rotation 1, but with a direction at the annular gap 12 being forced by the bounding wall sections to differ from the direction of the axis of rotation 1. In the present case, fluid emerging from the ventilation channel 2 via the mouth opening 3 can thus flow against the first shielding hood 10, can flow deflected from there in the direction of the annular gap 12 and can flow there on the outer casing side against the wall of the ventilation channel 2. The fluid flow is thus deflected by at least 180°, in particular >180°.

The mouth edge 5 of the mouth opening 3 of the ventilation channel 2 and the mouth edge 11 of the first shielding hood 10 are dimensioned here in cross section in such a manner that the first shielding hood 10 can freely encompass, or notionally move relative to, the ventilation channel 2 in the direction of the axis of rotation 1. In other words, the mouth edges 5, 11 of the mouth opening 3 of the ventilation channel 2 and of the first shielding hood 10 are dimensioned in such a manner that the mouth edge 11 of the first shielding hood 10 has at least the same cross section as the mouth edge 5 of the mouth opening 3 of the ventilation channel 2. The mouth edge 11 of the first shielding hood 10 is preferably provided with a larger cross section than the mouth edge 5 of the mouth opening 3 of the ventilation channel 2.

A second shielding hood 13 is arranged at a distance from the first shielding hood 10 in such a manner that the first shielding hood 10 and the second shielding hood 13 ensure a two-shell shielding of the mouth opening 3 of the ventilation channel 2. For this purpose, the second shielding hood 13 has a substantially rotationally symmetrical design, with a convexly configured wall of the first shielding hood 10 facing a substantially concavely configured wall of the second shielding hood 13. The convexly formed wall section of the first shielding hood 10 extends here with respect to the mouth opening 3 on the side facing away from the mouth opening 3, with the concavely curved wall section of the second shielding hood 13 facing the mouth opening 3 of the ventilation channel 2. A channel is delimited between the convexly and concavely shaped wall sections of the first shielding hood 10 and of the second shielding hood 13. The channel is penetrated by webs 14 by means of which the first shielding hood 13 is supported on the second shielding hood 14 such that the first shielding hood 10 can be positioned in a manner freely suspended in front of the mouth opening 3 of the ventilation channel 2. Owing to the curvature of the first shielding hood 10, a groove 15 encircling coaxially with respect to the axis of rotation 1 is formed on the inner casing side in the first shielding hood 10. In the region of its largest radial extent, the groove 15 has a groove base from which groove flanks rise in order to bound the groove base. One of the groove flanks of the groove 15 of the first shielding hood 10 extends as far as the mouth edge 11 of the first shielding hood 10.

A further radially encircling groove 16 is arranged on the outer casing side in a wall of the ventilation channel 2. The groove 16 is formed by the shaping of the wall of the ventilation channel 2, with a groove base being arranged in the region of a cross-sectional reduction of the ventilation channel 2. Groove flanks emerge from the groove base, with the one groove flank extending as far as the mouth edge 5 of the mouth opening 3 of the ventilation channel 2. The other groove flank merges into the stop 6 which is formed here completely annularly encircling the ventilation channel 2. Accordingly, a substantially S-shaped profile of the grooves 15, 16 of the first shielding hood 10 and of the ventilation channel 2 is provided in section, in a manner interrupted by the annular gap 12. The groove base of the groove 15 of the first shielding hood 10 is arranged in front of the mouth opening 3 of the ventilation channel 2 with respect to the axis of rotation 1. The groove base of the further groove 16 of the ventilation channel 2 lies, with respect to the axis of rotation, below the groove base of the groove 15 of the first shielding hood 10.

The second shielding hood 13 has a groove 17 on its outer circumference. The groove 17 is arranged coaxially with respect to the grooves 15, 16 of the ventilation channel 2 and of the first shielding hood 10. Owing to its arrangement on the outer casing side, the groove 17 opens with its groove base and the groove flanks analogously to the further groove 16 in the wall of the ventilation channel 2 on the outer casing side. The groove base here is positioned in such a manner that groove flanks emerging therefrom extend as far as the stop 6, i.e. as far as the outer circumference of the stop 6, such that a joint 18 is formed between the second shielding hood 13 and the stop 6. The diameter of the groove base of the groove 17 of the second shielding hood 13 is preferably provided here with at least the same diameter as the groove base of the groove 15 of the first shielding hood 10. This diameter is preferably larger. The groove base is positioned with respect to the groove 15 of the first shielding hood 10 and with respect to the further groove 16 on the ventilation channel 2 in such a manner that the groove base of the groove 17 of the second shielding hood 13 is positioned in the direction of the axis of rotation between the groove base of the groove 15 of the first shielding hood 10 and the groove base of the groove 16 of the ventilation channel 2.

In the region of the groove 17 of the second shielding hood 13, a further annular gap 12a is formed between the second shielding hood 13 and the first shielding hood 10. The annular gap 12 between the mouth edge 5 of the ventilation channel 2 and the first shielding hood 10, and also the further annular gap 12a between the mouth edge 11 of the first shielding hood 10 and the second shielding hood 13 encompassing the latter on the outside are bounded here by walls in each case differing in orientation. That is to say, the annular gap 12 between the mouth edge 5 of the mouth opening 3 of the ventilation channel 2 and the mouth edge 11 of the first shielding hood 10 is bounded by mouth edges 5, 11 oriented in opposite directions, whereas the further annular gap 12a between the first shielding hood 10 and the second shielding hood 13 is arranged between mouth edges 11 oriented in the same direction. The mouth edge 11 of the mouth opening of the first shielding hood 10 is used both for bounding the annular gap 12 toward the mouth edge 5 of the ventilation channel 2 and for bounding the further annular gap 12a toward the second shielding hood 13. The annular gaps 12, 12a are arranged substantially coaxially here, with the directions through the walls bounding them each differing from a perpendicular and preferably being oriented here at an angle toward the axis of rotation 1.

In order to permit passage or dripping of foreign matter, such as liquids, entering the grooves 15, 16, 17, ventilation openings 19 are arranged both in the first shielding hood 10 and in the second shielding hood 13. The ventilation openings 19 are distributed substantially in each case on a circular path. The first shielding hood 10 is thus penetrated by ventilation openings 19 on a first circular path 20. The second shielding hood 13 is penetrated by ventilation openings 19 on a second circular path 21. Furthermore, the second shielding hood 13 is penetrated by ventilation openings 19 which are arranged on a third circular path 22. The second shielding hood 13 is furthermore at least partially penetrated by ventilation openings 19 which are arranged on a fourth circular path 23.

Ventilation openings 19 are in each case distributed on the circular paths 20, 21, 22, 23. The ventilation openings 19 preferably have a circular cross section and extend in each case through a wall of the first or the second shielding hood 10, 13. Openings are introduced into the second shielding hood 13 via the ventilation openings 19 lying on the second circular path 21. Gases or liquids can pass via the openings through a wall of the second shielding hood 13. Communication is thus permitted between the exterior of the second shielding hood 13 and the channel formed between the first and second shielding hoods 10, 13. The ventilation openings 19 on the second circular path 21 substantially permit passage of a liquid or a gas or a particle parallel to the axis of rotation 1. The diameter of the second circular path 21 is smaller here than the diameter of the first circular path 20 with the ventilation openings 19 which are correspondingly distributed thereon and penetrate a wall of the first shielding hood 10. The first circular path 20 is arranged in a groove flank of the groove 15, thus enabling passage of a fluid or a particle located in the groove 15. For this purpose, the diameter of the first circular path 20 is preferably larger than the diameter of the mouth edge 5 of the mouth opening 3 of the ventilation channel 2.

The third circular path 22 extends on a wall section of the second shielding hood 13. The third circular path 22 is arranged here in a first groove flank of the groove 17 of the second shielding hood 13. The fourth circular path 23 with ventilation openings 19 is arranged in a second groove flank of the groove 17. The fourth circular path 23 is arranged here in such a manner that ventilation openings 19 which are also bounded by the stop 6 are arranged within the joint 18 in the second shielding hood 13. The joint 15 is thereby penetrated by ventilation openings 19.

The diameter of the fourth circular path 23 is approximately the same as the third circular path 22, with it also being possible for the fourth circular path 23 to be larger than the third circular path 22. Both the third circular path 22 and the fourth circular path 23 have a larger diameter than the second circular path 21 and the first circular path 20.

In addition to positioning the ventilation openings 19 on circular paths 20, 21, 22, 23, said ventilation openings can also be positioned differently therefrom. However, it should preferably be provided that respective ventilation openings 19 are distributed about the axis of rotation 1 such that, in the event of different installation positions, one ventilation opening 19 also always is positioned in the vicinity of a low point or a high point. Furthermore, the ventilation openings 19 can also be arranged on differing paths. In each case, however, care should be taken to ensure that a direct passage from one ventilation opening 19 of a shielding hood 10, 13 to a ventilation opening 19 of another shielding hood 13, 10 is blocked such that fluid or a particle passing through a ventilation opening 19 impacts against a wall and is deflected.

A ventilation arrangement, as shown in the figures, is advantageously designed to be UV-resistant. The ventilation arrangement can preferably be formed from a metallic material. For example, the shielding hood 10, 13 and the ventilation channel 2 and also the stop 6 can be formed as discrete assemblies, whereupon the latter are joined together using fastening means, for example webs, screws, bolts or adhesive connections, to form an angularly rigid assembly of a ventilation arrangement. Furthermore, it can also be provided that the ventilation arrangement is produced by an additive manufacturing method. An additive manufacturing method preferably brings about a lengthwise construction of the ventilation arrangement. This provides the possibility of finally forming an integral, low-mass ventilation arrangement. In addition to metallic materials, electrically insulating materials, such as plastics, porcelains, etc., can also be used as the material for the ventilation arrangement. Irrespective of the selected type of material, it can be advantageously provided that the ventilation arrangement is manufactured from UV-resistant material in particular in an outer region, i.e. in particular in the region of the second shielding hood 13 and of the stop 6.

Figure 2:
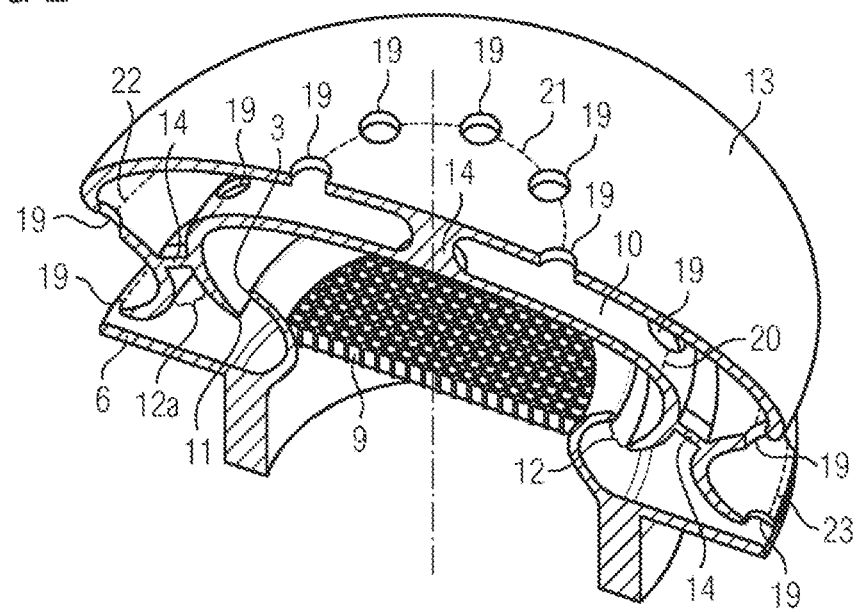
FIG. 2 shows a perspective view of the ventilation arrangement known from FIG. 1 in section.

FIG. 2 shows the ventilation arrangement which is known from FIG. 1 with the same sectional plane, but in a perspective illustration. The structure of the filter 9 which is advantageously introduced within the ventilation channel 2 within the scope of an additive manufacturing method can now be seen. In the perspective illustration, it furthermore becomes clear that the ventilation openings 19 arranged in each case within the first and second shielding hood 10, 13 are oriented in such a manner that they each lie in front of or behind a wall, for example of a shielding hood (for example the first shielding hood 10) or of the stop 6 or the wall 4 of the ventilation channel 2 in the perpendicular passage direction. This makes direct passage through a plurality of walls difficult.

Figure 3:
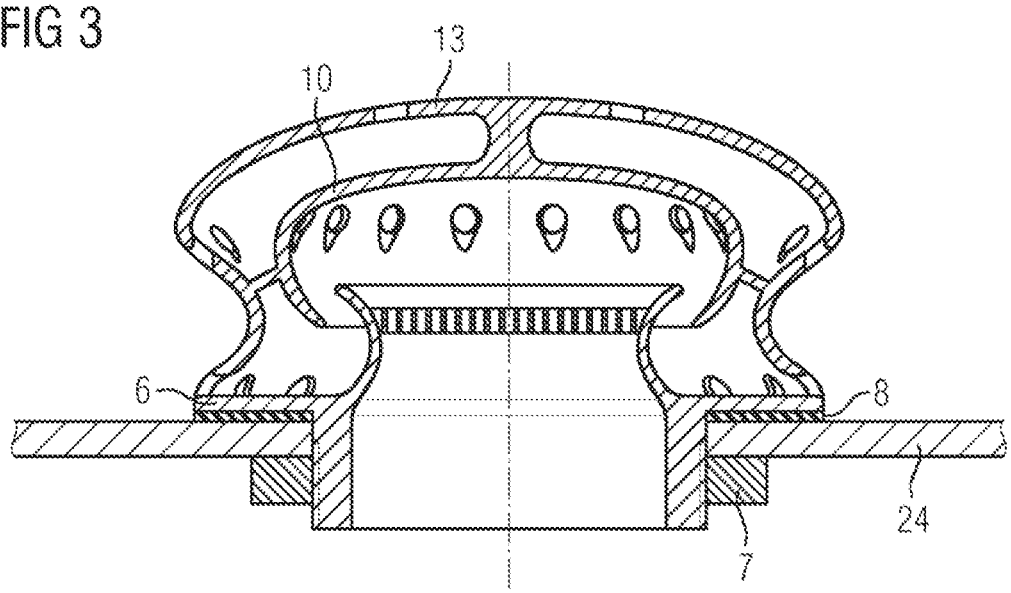
FIG. 3 shows the ventilation arrangement in section in an installed position.

In FIG. 3, the sectional illustration known from FIG. 1 is shown in the mounted state. A recess in which the ventilation channel 2 is inserted in a complementary manner in terms of shape is introduced in a housing wall of a housing 24. A seal 6 is arranged around the stop 6 and lies annularly between the stop 6 and the housing wall of the housing 24. The stop 6 can be braced by means of the union nut 7 against the housing wall with the interposition of the seal 8, with the seal 8 being compressed such that an undesired passage through of a liquid or a particle in the region of the outer casing of the ventilation channel 2 is prevented. Communication of the interior of the housing 24 through the housing wall with the surroundings is permitted via the ventilation openings 19 and the flow paths, which are located in the interior of the second shielding hood 13, as far as the mouth opening 3 and the filter 9 arranged there.

FIGS. 4 to 8 show various installation positions of the ventilation arrangement, wherein a path for conducting away particles or liquids is in each case shown by way of example by means of arrows.

Figure 4:
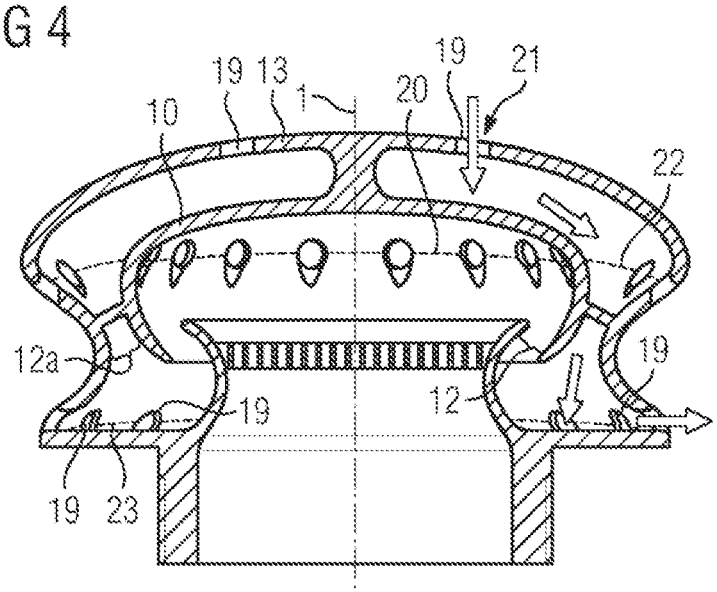
FIG. 4 shows the ventilation arrangement in section in an upright installation position.

FIG. 4 shows a vertical orientation of the axis of rotation 1. Accordingly, particles which enter through ventilation openings 19 of the second circular path 21 can slide off on the outer casing surface of the first shielding hood 10 and via the channel between the first shielding hood 10 and the second shielding hood 13 through the further annular gap 12a as far as the stop 6. The further groove 16 prevents penetration into the ventilation channel 2. Undesired foreign matter, such as particles or liquids, can drip or fall to the outside via the ventilation openings 19 of the fourth circular path 23.

Figure 5:
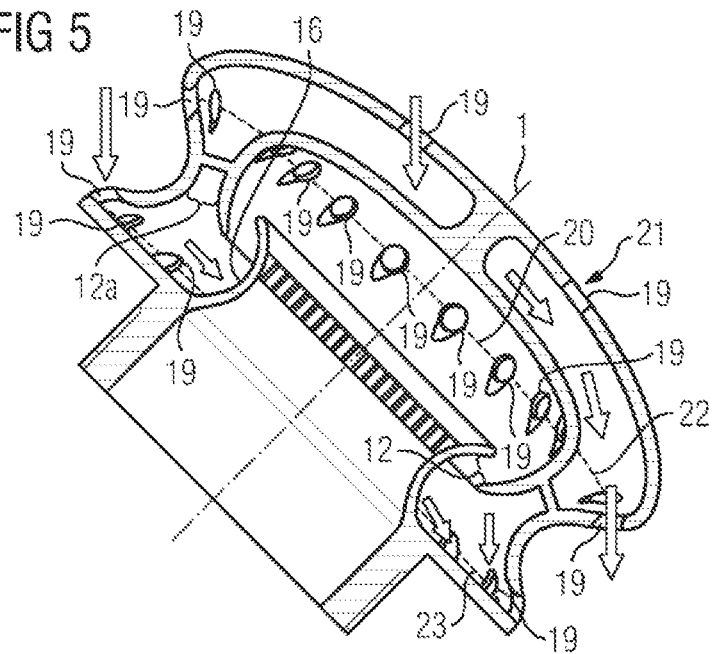
FIG. 5 shows the ventilation arrangement in section in an oblique installation position.

FIG. 5 shows an oblique orientation of the axis of rotation 1, with a deflection by approx. 45° being shown in the clockwise direction. There is now the possibility that, for example, particles or moisture can penetrate the interior of the ventilation arrangement through ventilation openings 19 of the second circular path 21 or of the fourth circular path 23. Particles or moisture penetrating the region between the first shielding hood 10 and second shielding hood 13 via ventilation openings 19 of the second circular path 21 can slide away there on the outer surface of the first shielding hood 10 where they can either drip off via ventilation openings 19 of the third circular path 22 or, on further sliding away via the further annular gap 12a, which is formed between the mouth edge 11 of the first shielding hood 10 and the second shielding hood 13, can slide in the direction of the stop 6 and can be conducted out of the ventilation arrangement from there via ventilation openings 19 of the fourth circular path 23. Further ventilation openings 19 of the fourth circular path 23 can optionally serve for entry of liquids or particles, wherein said liquids or particles are conducted around the ventilation channel 2 via the further groove 16 in the wall thereof and, at the end which is substantially opposite, can slide off into the surroundings via ventilation openings 19 of the fourth circular path 23.

Figure 6:
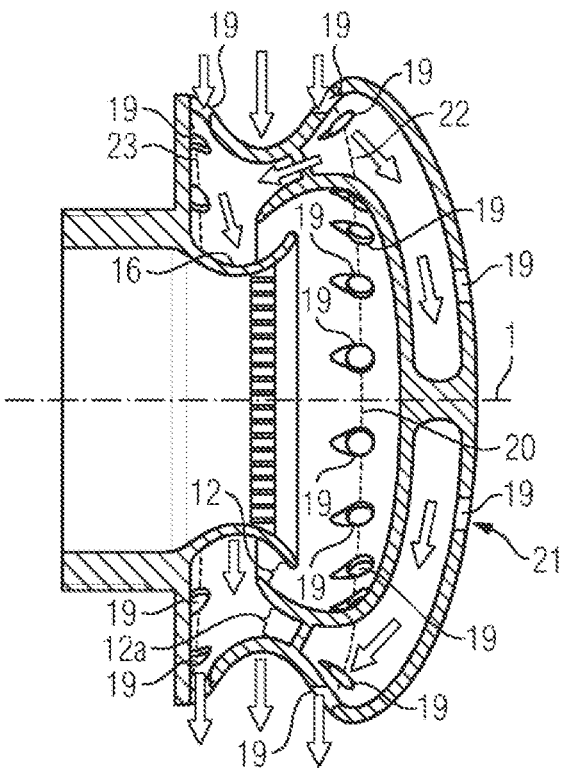
FIG. 6 shows the ventilation arrangement in section in a horizontal installation position.

FIG. 6 is a horizontal orientation of the axis of rotation 1 of the ventilation arrangement. Particles or liquids can enter the interior of the ventilation arrangement via ventilation openings 19 of the third circular path 22. Said particles or liquids can either be conducted away via the region between the outer wall of the first shielding hood 10 and the inner wall of the second shielding hood 13 and can emerge in turn from ventilation openings 19 of the third circular path 22. Alternatively, particles or moisture can also slide away via the further annular gap 12a between the mouth edge 11 of the first shielding hood 10 and the second shielding hood 13, wherein said liquids or particles are conducted away in the further groove 16 on the outer casing side around the ventilation channel 2 and pass from there into the region of the joint 18 in order to be again output there into the surroundings of the ventilation arrangement from ventilation openings 19 of the fourth circular path 23.

Figure 7:
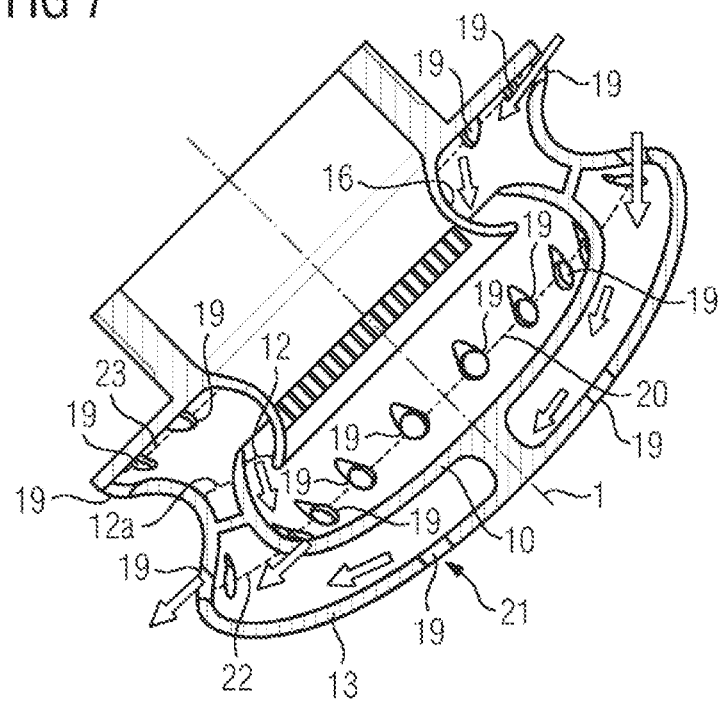
FIG. 7 shows the ventilation arrangement in section in an oblique installation position upside down.

FIG. 7 shows an oblique arrangement of the axis of rotation 11, wherein a deflection of approximately 135° in the clockwise direction, starting from a vertical arrangement, is illustrated here. Particles which pass through ventilation openings 19 of the third circular path 22 into the region between the first shielding hood 10 and the second shielding hood 13 can slide off there again and can also emerge again from the ventilation arrangement via substantially oppositely arranged ventilation openings 19 of the third circular path 22. Furthermore, there is the possibility of ventilation openings 19 of the fourth circular path 23 ensuring an entry of liquids or other fluids or particles. These can then be conducted around the ventilation channel 2, for example in the further groove 16 of the ventilation channel 2, and can be conducted from there into the concavely shaped section, i.e. in particular into the region of the inherently closed, encircling groove 15 of the first shielding hood 10. The annular gap 12 can be used for the transition from the further groove 16 into the concavely shaped section of the first shielding hood 10. From said annular gap, foreign matter can pass via the ventilation openings 19 lying on the first circular path 20 into the region between the first shielding hood 10 and the second shielding hood 13 and can pass from there, for example via ventilation openings 19 of the third circular path 22, into the surroundings of the ventilation arrangement.

Figure 8:
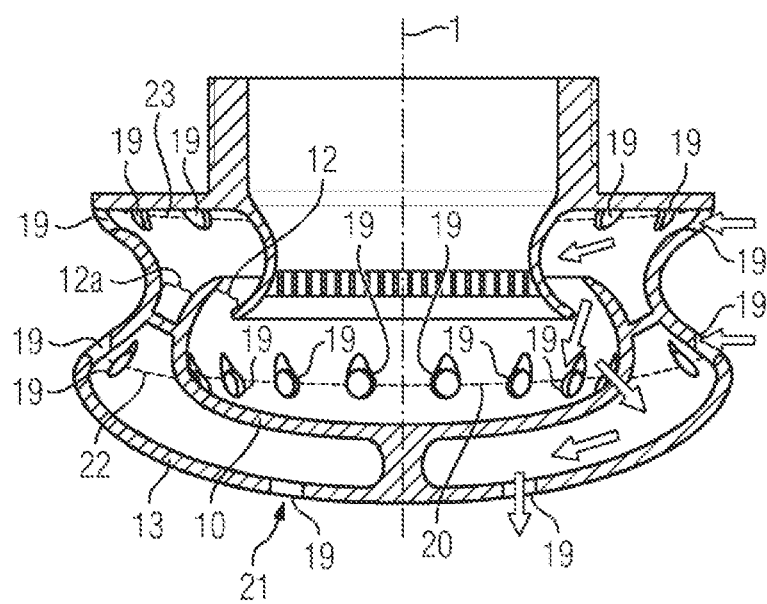
FIG. 8 shows the ventilation arrangement in an installation position upside down.

FIG. 8 shows a vertical installation position of the ventilation arrangement, wherein the axis of rotation 1 is arranged vertically. In a departure from the position as shown in FIG. 4, an orientation of the ventilation arrangement rotated by 180° (upside down) is now provided. Fluids or particles entering via ventilation openings 19 of the fourth circular path 23 or the third circular path 22 can now in each case emerge into the surroundings via ventilation openings 19 of the second circular path 21. Fluids or particles entering via ventilation openings located in the third circular path 22 can move here, for example, directly to the ventilation openings 19 of the second circular path 21. When particles or fluids enter the region of the ventilation openings 19 of the fourth circular path 23, the possibility is provided that they can be conducted either via the further groove 16 or the groove 15 of the first shielding hood 10 (through the annular gap 12) into the region of the ventilation openings 19 of the first circular path 20, whereupon they pass from there into the channel between the first shielding hood 10 and the second shielding hood 13. From said channel, the particles or the fluid can emerge into the surroundings of the second shielding hood 13 via the ventilation openings 19 of the second circular path 21. Fluids or particles entering via the ventilation openings 19 of the fourth circular path 23 can optionally also drip off on a convex wall of the second shielding hood 13 and can be conducted directly into the channel between the first shielding hood 10 and the second shielding hood 13.

As can be seen with reference to FIGS. 4 to 8, it is ensured independently of the installation position of the ventilation arrangement that an undesired direct penetration of fluids or particles into the mouth opening 3 of the ventilation channel 2 is made difficult. The mouth opening 3 of the ventilation channel 2 is protected by the shaping of the wall of the ventilation channel 2 of the first shielding hood 10 and of the second shielding hood 13. Owing to the position or the arrangement of the ventilation openings 19 on the various circular paths 20, 21, 22, 23, a gravity-driven emptying of grooves or connecting points for particles or fluids is also made possible here.

The invention claimed is:

1. A ventilation arrangement for a housing, the ventilation arrangement comprising:
   a ventilation channel formed with a mouth opening, said ventilation channel having a widening and/or narrowing cross section toward said mouth opening;
   a first shielding hood shielding said mouth opening, said shielding hood encompassing said mouth opening, leaving a gap between said shielding hood and said mouth opening free; and
   a second shielding hood encompassing said first shielding hood;
   wherein said second shielding hood is connected to a wall of said ventilation channel and said first shielding hood is supported on said second shielding hood so as to be suspended in front of said mouth opening.

2. The ventilation arrangement according to claim 1, wherein said shielding hood for encompassing said mouth opening has a cross-section with a cross-sectional area that increases in a direction that is opposite to a direction in which a cross-sectional area of said ventilation channel increases in a region of said mouth opening.

3. The ventilation arrangement according to claim 1, wherein mutually facing mouth edges of said ventilation channel and said first shielding hood do not overlap one another in an axial direction.

4. A ventilation arrangement for a housing, the ventilation arrangement comprising:
   a ventilation channel formed with a mouth opening, said ventilation channel having a widening and/or narrowing cross section toward said mouth opening;
   a first shielding hood shielding said mouth opening, said shielding hood encompassing said mouth opening, leaving a gap between said shielding hood and said mouth opening free; and
   a second shielding hood encompassing said first shielding hood;
   wherein an outer casing side of said ventilation channel and an outer casing side of said second shielding hood are formed with circumferentially running grooves.

5. The ventilation arrangement according to claim 4, wherein said first shielding hood is formed with a groove running circumferentially on an inner casing side.

6. A ventilation arrangement for a housing, the ventilation arrangement comprising:
   a ventilation channel formed with a mouth opening, said ventilation channel having a widening and/or narrowing cross section toward said mouth opening; and
   a shielding hood shielding said mouth opening, said shielding hood encompassing said mouth opening, leaving a gap between said shielding hood and said mouth opening free;
   wherein said shielding hood is formed with a groove running circumferentially on an inner casing side.

7. The ventilation arrangement according to claim 5, wherein a groove base of said groove of said ventilation channel is arranged in an axial sequence below groove bases of said grooves formed in said first and second shielding hoods.

8. The ventilation arrangement according to claim 5, wherein a groove base of said groove formed in said first shielding hood is arranged in an axial sequence both above a groove base of said groove of said ventilation channel and above a groove base of said groove formed in said second shielding hood.

9. The ventilation arrangement according to claim 5, wherein a ventilation opening is arranged at least in one groove flank of a groove at a distance from a groove base of said groove on the inner casing side of said first shielding hood.

10. The ventilation arrangement according to claim 1, further comprising a filter arranged in said ventilation channel.

11. The ventilation arrangement according to claim 1, wherein a stop is formed for an outer-casing-side thread.

12. The ventilation arrangement according to claim 1, wherein said shielding hood is one of two coaxial shielding hoods and at least one of said shielding hoods is supported on a stop.

13. The ventilation arrangement according to claim 1, wherein a joint between said shielding hood and a stop is formed with at least one ventilation opening.

14. The ventilation arrangement according to claim 1, configured to be UV-stable.

15. A device, comprising:
   a closed housing with a housing wall; and
   a ventilation arrangement according to claim 1 penetrating said housing wall.

16. The device according to claim 15, wherein the housing is a housing of a switch cabinet.

* * * * *